(12) United States Patent
Ausschnitt et al.

(10) Patent No.: US 8,361,683 B2
(45) Date of Patent: Jan. 29, 2013

(54) MULTI-LAYER CHIP OVERLAY TARGET AND MEASUREMENT

(75) Inventors: Christopher P. Ausschnitt, Boca Raton, FL (US); Allen H. Gabor, Hopewell Junction, NY (US); Nelson M. Felix, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 413 days.

(21) Appl. No.: 12/757,344

(22) Filed: Apr. 9, 2010

(65) Prior Publication Data

US 2011/0248388 A1    Oct. 13, 2011

(51) Int. Cl.
*G03F 9/00* (2006.01)
*G01B 11/00* (2006.01)

(52) U.S. Cl. ............ 430/22; 430/30; 356/40; 356/614; 438/975

(58) Field of Classification Search .................... 430/22, 430/30; 356/401, 614; 438/975
See application file for complete search history.

(56) References Cited

U.S. PATENT DOCUMENTS

| 5,877,861 | A  | 3/1999  | Ausschnitt et al. |
| 6,638,671 | B2 | 10/2003 | Ausschnitt et al. |
| 7,474,401 | B2 | 1/2009  | Ausschnitt et al. |

*Primary Examiner* — Christopher Young
(74) *Attorney, Agent, or Firm* — Cantor Colburn LLP; Parashos Kalaitzis

(57) ABSTRACT

A wafer includes an active region and a kerf region surrounding at least a portion of the active region. The wafer also includes a target region having a rectangular shape with a width and a length greater than the width, the target region including one or more target patterns, at least one of the target patterns being formed by two sub-patterns disposed at opposing corners of a target rectangle disposable within the target region.

15 Claims, 8 Drawing Sheets

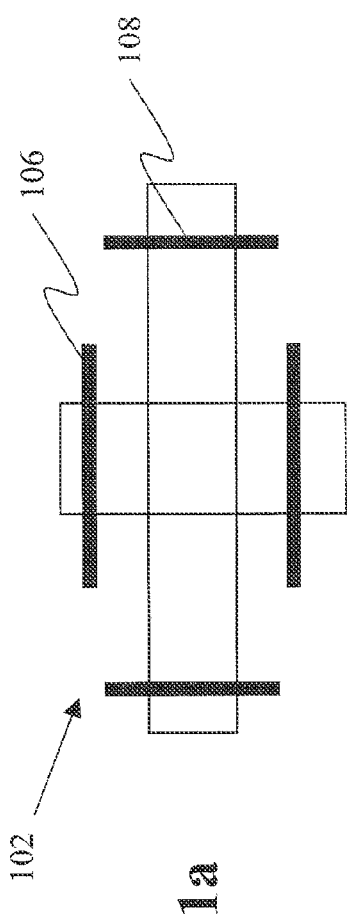
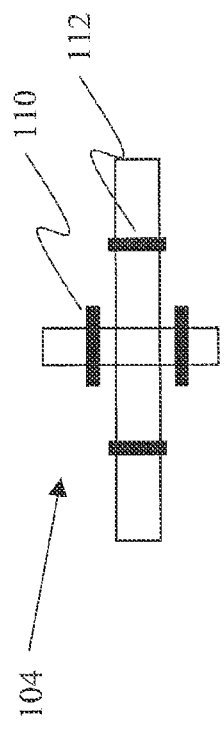
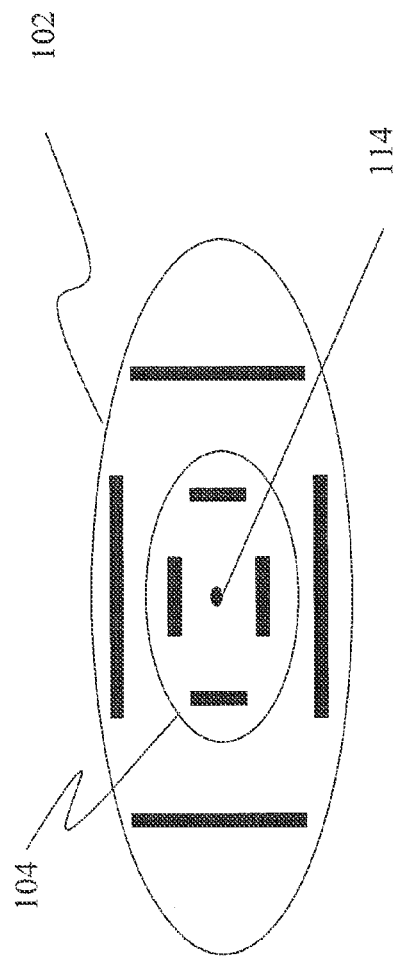
Fig. 1a
Fig. 1b
Fig. 1c

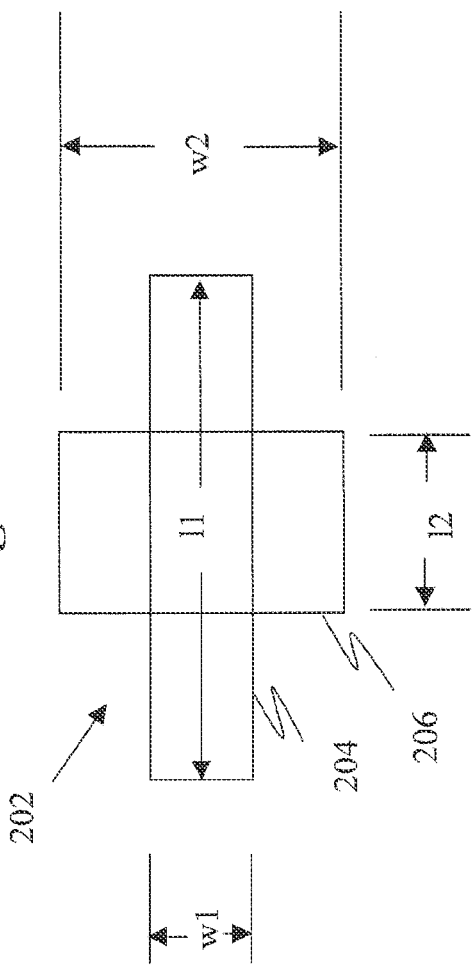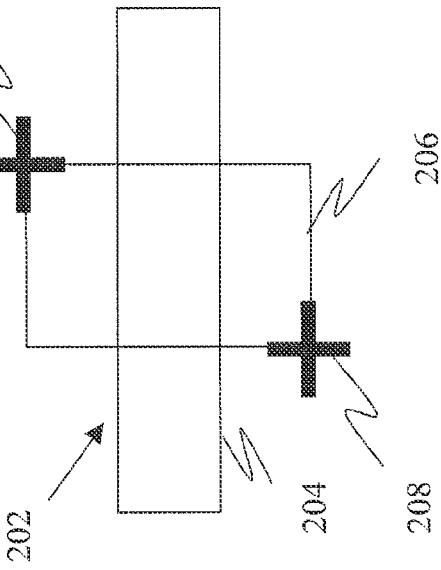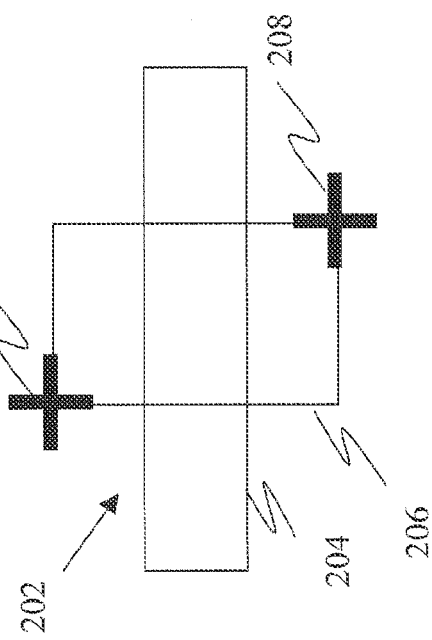

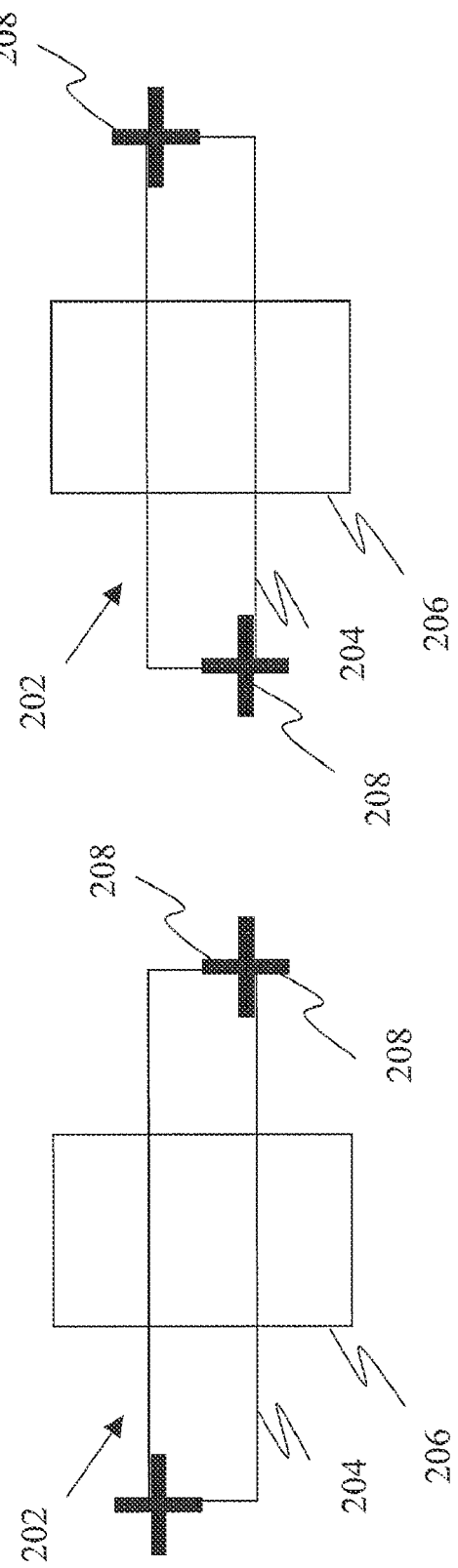

MULTI-LAYER CHIP OVERLAY TARGET AND MEASUREMENT

BACKGROUND

The present invention relates to the manufacture of integrated circuits and, in particular, to a method and system for determining alignment or overlay error of integrated circuit fields within and between circuit layers made by a lithographic process.

Semiconductor manufacturing requires the sequential patterning of process layers on a single semiconductor wafer. Exposure tools known as steppers print multiple integrated circuit patterns or fields (also known as product cells) by lithographic methods on successive layers of the wafer. These steppers typically pattern different layers by applying step and repeat lithographic exposure or step and scan lithographic exposure in which the full area of the wafer is patterned by sequential exposure of the stepper fields containing one or more integrated circuits. Typically, 20-50 layers are required to create an integrated circuit. In some cases, multiple masks are required to pattern a single layer.

For the purposes of this application, the "alignment" and "overlay" of sequential patterning steps are distinguished as follows. Alignment is the position of an existing wafer target with respect to the exposure tool. Alignment error is the deviation of the location of the wafer target from its designed location, as determined by the alignment system of the exposure tool. Alignment to an existing layer (the aligned-to layer) is followed by the exposure that prints a new layer. On the other hand, overlay is the relative position among two or more patterns produced by successive exposures; most commonly, the relative position of the current layer and the aligned-to layer. Overlay error is the deviation of the relative position among patterns from their designed relative positions, as determined by an overlay metrology tool. To ensure circuit functionality, overlay errors must be minimized among all wafer patterns, consistent with the ground rules of the most critical circuit devices. As a rule of thumb, the overlay error between any pair of layers must be less than 40% of the minimum dimension. Thus, acceptable yield at the 70 nm node implies a layer-to-layer overlay tolerance of less than 30 nm. Achievement of such tight overlay tolerances over 300 mm wafers requires control of both layer-to-layer and within-layer overlay error, as described in U.S. Pat. Nos. 5,877,861 and 6,638,671.

Alignment and overlay both require specialized targets on each layer. The targets are placed in inactive areas of the wafer, either within the chip boundary or in the narrow dicing channel (kerf) that separates adjacent chips. In principle, alignment could use the prior layer components of the overlay target as align-to patterns. In practice, alignment and overlay metrology systems often require different target designs and locations. Overlay targets can be comprised of sub-patterns from both the same and different masks. The images are analyzed to determine the relative layer-to-layer and within-layer placement of the sub-patterns among the various mask layers printed on the wafer. Each determination of overlay error requires paired sub-patterns within a target whose relative position can be measured. From the overlay measurement perspective, therefore, the effective number of layers can be double the number of masks used in the patterning process. For this technical specification, the term layer is defined as any patterning step that requires a unique set of overlay sub-patterns.

One prior art approach has been not utilize a nested box, frame or bar target on successive lithographic layers as targets. Another option has been to utilize periodic or grating targets on successive lithographic layers.

Ideally, a target system to determine alignment and overlay error between lithographically produced integrated circuit fields on the same or different lithographic levels would be able to measure alignment and overlay error among many of the lithographic levels required to create an integrated circuit, and do so using a minimum of wafer surface area.

SUMMARY

According to one embodiment of the present invention, a method of determining positioning error between lithographically produced integrated circuit fields on at least one lithographic level is disclosed. The method of this embodiment includes: creating a first target pattern on a lithographic field containing a first integrated circuit pattern, the first target pattern and the lithographic field being on a lithographic level, the first target pattern comprising two first sub-patterns at first opposing corners of a first rectangle having a first width and a first length, the first length being different than the first width; creating a second target pattern on a different lithographic field containing a second integrated circuit pattern, the second target pattern and the different lithographic field being on the a different lithographic level than the first target pattern, the second target pattern comprising two second sub-patterns at second opposing corners of the first rectangle; determining the center of the first target pattern and the center of the second target pattern; and measuring positioning error between the lithographic fields by comparing locations of the first target pattern center and the second target pattern center.

According to one embodiment of the present invention, a method of determining positioning error between lithographically produced integrated circuit fields on at least one lithographic level is disclosed. The method of this embodiment includes creating a first target pattern on a lithographic field containing a first integrated circuit pattern, the first target pattern and the lithographic field being on a lithographic level, the first target pattern comprising two first sub-patterns at first opposing corners of a first rectangle having a first width and a first length, the first length being different than the first width; creating a second target pattern on a different lithographic field containing a second integrated circuit pattern, the second target pattern and the different lithographic field being on the a different lithographic level than the first target pattern, the second target pattern comprising two second sub-patterns at opposing corners of a second rectangle, the second rectangle being at a right angle to the first rectangle, the second rectangle having a second width and a second length different than the second width; determining the center of the first target pattern and the center of the second target pattern; and measuring positioning error between the lithographic fields by comparing locations of the first target pattern center and the second target pattern center.

According to another embodiment of the present invention, a wafer is disclosed. The wafer of this embodiment includes an active region and a kerf region surrounding at least a portion of the active region. The wafer also includes a target region having a rectangular shape with a width and a length greater than the width, the target region including one or more target patterns, at least one of the target patterns being formed by two sub-patterns disposed at opposing corners of a target rectangle disposable within the target region.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 1a-1c show examples of target centers that may be utilized in the target patterns disclosed herein;

FIG. 2a-2e show layout configurations for several different target patterns;

DETAILED DESCRIPTION

Figure 3:
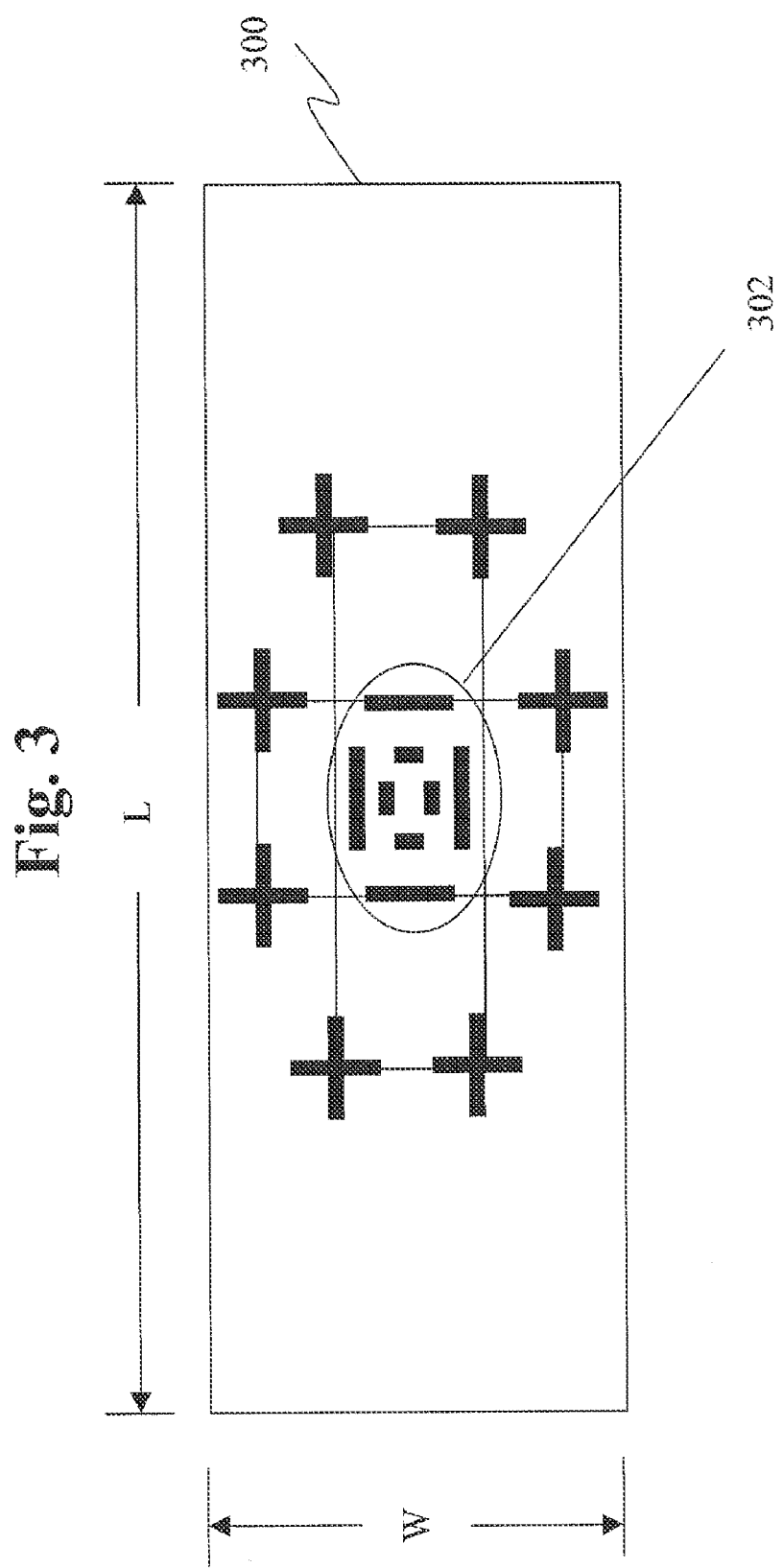
FIG. 3 shows multiple target patterns overlaying one another.

The target system of the present invention places a plurality of sub-patterns at a increasing radial distances about a common center, such that the sub-patterns are symmetric about a target pattern center and preferably define at least two opposing corners of the four corners of a geometric shape. In one embodiment, the geometric shapes used to form the target patterns are parallelograms. In one embodiment, the geometric shape is a rectangle. The sub-patterns, in one embodiment, are located within an outer boundary that shares the common center. In one embodiment, the outer boundary forms a rectangle. In a particular embodiment, a length of the outer boundary is longer than its width. In a more particular embodiment, the length of the outer boundary is at least twice its width. In another embodiment, the length of the outer boundary is more than twice its width. In one embodiment, the outer boundary has width of 10.5 micrometers and a length of 30.5 micrometers.

In the prior art, targets were typically relegated to the kerf region of wafer. This was due, at least in part, to the square nature of the target. Square patterns lead to a square target region. For a number of reasons, it may be undesirable or impossible to place a square target region in an active area of a wafer. For example, a square target region may have a width/length that does not allow for metal traces to effectively be routed around it and, effectively, makes any region where the targets a located into a de facto inactive region.

According to one embodiment, the rectangular shape of the outer boundary allows the targets to be placed in the active area of a field in a wafer. That is, in one embodiment, the target is not located in the kerf.

In one embodiment, the targets are formed based on one of two different possible target center configurations. FIGS. 1a and 1b show two possible different target center configurations.

In particular, FIG. 1a shows first target center 102. The first target center 102 may include horizontal lines 106 and vertical lines 108. In one embodiment, the lengths of the horizontal lines 106 and vertical lines 108 are different so that orientation may be measured.

It shall be understood, that the processing device (lithographic device) for fabricating integrated circuits may include a position detector having a field-of-view (FOV). The position detector may detect the differences in lengths of the horizontal lines 106 and the vertical lines 108 as one method for determining orientation.

FIG. 1b shows a second target center 104. The second target center 108 may include horizontal lines 110 and vertical lines 112. In one embodiment, the lengths of the horizontal lines 110 and vertical lines 112 are different so that orientation may be measured.

In one embodiment, and as shown in FIG. 1c, the second target center 104 may be sized so that it may lie within the first target center 102. Accordingly, in such an embodiment, layers may be separated into stackable groups. In one embodiment, the first target center 102 and the second target center 104 may be arranged such that they share a common center point 114. This arrangement of target centers enables placement of a target center on every process layers. The target centers may serve a dual purpose: first, they may enable target center pattern recognition and acquisition at every layer; second, they may enable the measurement of target center locations on every mask. The mask measurements can then be fed forward during wafer processing to correct the overlay measurements between any layer pair for the layer-specific mask placement errors. In some cases, processing precludes the superposition of patterns on successive layers; hence, the need to separate the target centers by stackable groups.

FIGS. 2a-2e show a base pattern 202 and four targets that may be formed thereon. A "target," in one embodiment, may include a target center and two sub-patterns. According to one embodiment of the present invention, each target has at most two-fold symmetry In more detail, FIG. 2a shows base pattern 202 from which targets may be formed. In one embodiment, four different targets maybe formed on the base pattern 202. The base pattern 202 may include a first rectangle 204 and a second rectangle 206. The first rectangle 204 is formed perpendicular to the second rectangle 206 in one embodiment.

The first rectangle 204 has a width $w_1$. This width ($w_1$), in one embodiment, is the same or substantially the same in every pattern utilized herein. That is, and as will be shown below, each pattern for forming a target includes a rectangle having a height of $h_1$.

The first rectangle 204 also includes a length $l_1$. Unlike $w_1$, $l_1$ varies between patterns. In particular, for each successive pattern, the length of the first rectangle 204 will vary. In one embodiment, each successive pattern includes a first rectangle that includes a length that is $2w_{extend}$ greater than the width of the previous first rectangle. In a particular embodiment, the length is extended by $l_{extend}$ on either end.

The second rectangle 206 has a length $l_2$. This length ($l_2$), in one embodiment, is the same or substantially the same in every pattern utilized herein. That is, and as will be shown below, each pattern for forming a target includes a rectangle having a length of $l_2$.

The second rectangle 206 includes a length $l_2$. Similar to $l_1$, $l_2$ varies between patterns. In particular, for each successive pattern, the length of the second rectangle 206 will increase.

The corners of the first rectangle 204 and the second rectangle 206 define possible locations for sub-patterns about a center point 208. According to one embodiment, each target is defined by two sub-patterns located on opposing corners of either the first rectangle or the second rectangle.

The sub-patterns may comprise elements symmetric about x- and y-axes. The sub-patterns may form a cross shape, and the cross shape may have arms comprising a single element or a plurality of elements. The elements of each sub-pattern may be used to determine centers of the sub-patterns, and the sub-pattern centers may be used to determine the target pattern centers. The center point 208 may be either the first target center 102 or second target center 104 (FIG. 1).

FIG. 2b shows a first target formed on base pattern 202. The target of FIG. 2b includes sub-patterns 208 disposed on a first set of opposing corners of the second rectangle 206. FIG. 2c shows a second target formed on base pattern 202. The target of FIG. 2c includes sub-patterns 208 disposed on a second set (different than the first set) of opposing corners of the second rectangle 206.

FIG. 2d shows a third target formed on base pattern 202. The target of FIG. 2d includes sub-patterns 208 disposed on a first set of opposing corners of the first rectangle 204. FIG. 2e shows a fourth target formed on base pattern 202. The target of FIG. 2e includes sub-patterns 208 disposed on a second set (different than the first set) of opposing corners of the first rectangle 204.

FIG. 3 shows the first through fourth targets of FIGS. 2b-2e all placed within an outer boundary 300. It shall be understood, the each target may be placed with either of the target centers described above. In addition, each target may be disposed on a different lithographic layer in one embodiment. Each target (and the outer boundary) is centered about one of the two target centers shown, collectively, by reference 302.

The outer boundary has a length L and width W. In one embodiment, the width is smaller than the length L. In one embodiment, the outer boundary 300 has a width (W) of 10.5 micrometers and a length (L) of 30.5 micrometers.

From the base pattern 202 (FIG. 2a), a second level (and subsequent levels) pattern may be formed.

Figure 4:
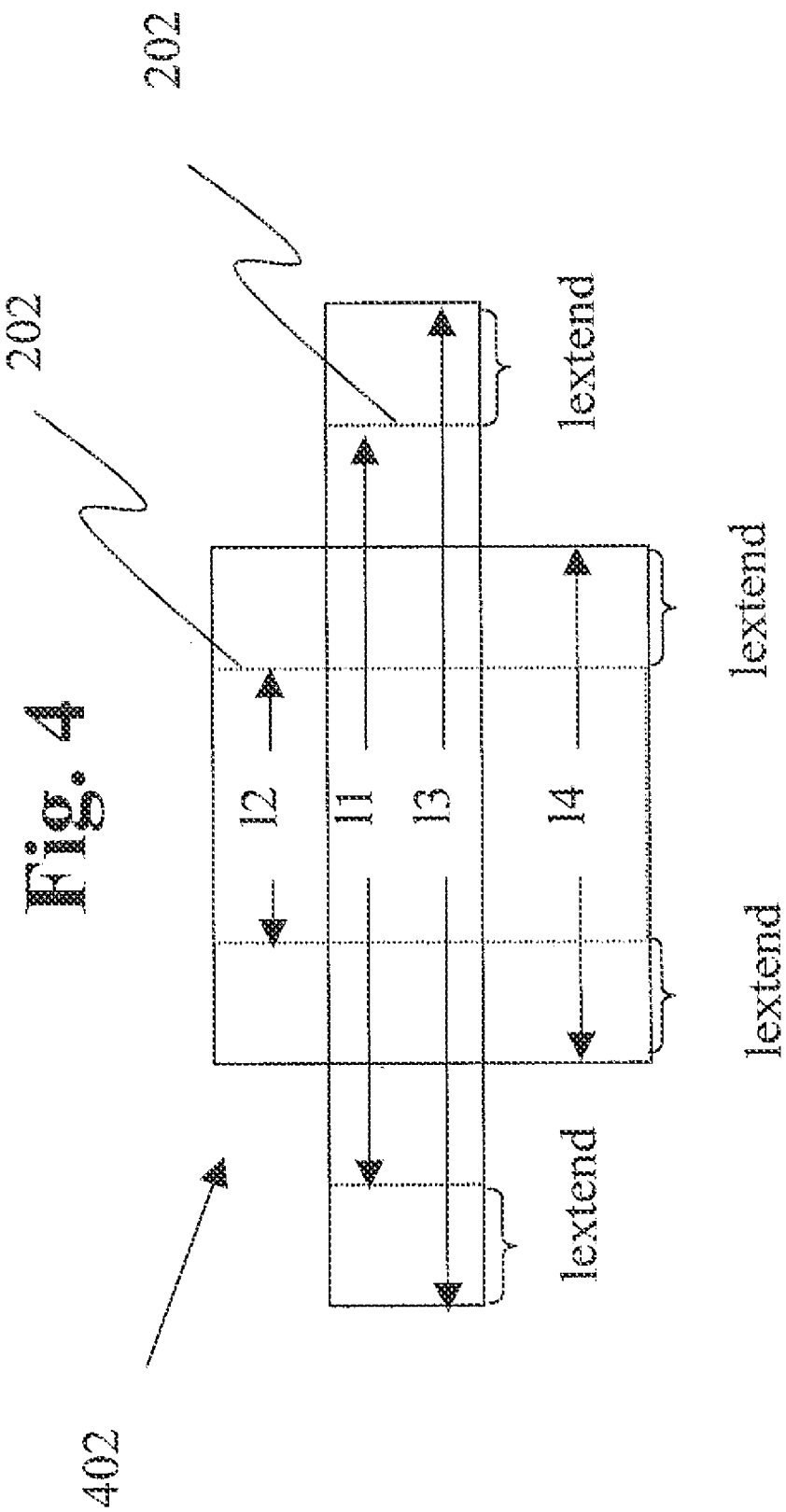
FIG. 4 shows two expanded target patterns based on the target patterns of FIGS. 2a-2e.

FIG. 4a shows a second level pattern 402 formed from the base pattern 202 (shown in dotted lines). The length of the first rectangle 404 of the second level pattern 402 ($l_3$) is extended by a distance of $l_{extend}$ in both directions from the length ($l_1$) of the base pattern 202. The same is true of $l_4$ with respect to $l_2$. Such enlarging may go on indefinitely to create multiple patterns. As discussed above, the widths $w_1$ and $w_2$ may remain constant for every pattern in one embodiment.

Figure 5:
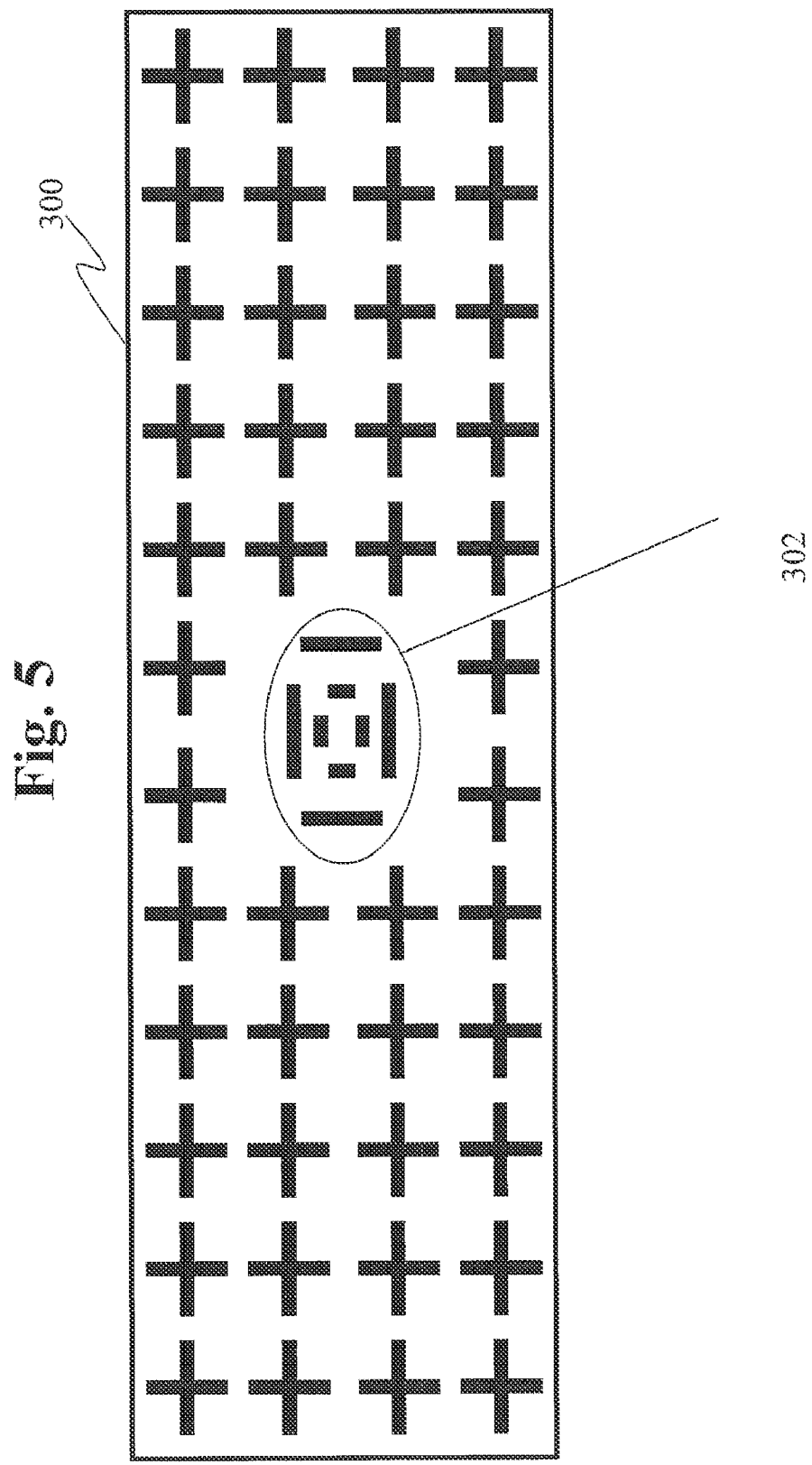
FIG. 5 shows a fully filled outer boundary according to one embodiment.

FIG. 5 shows an example of 22 different targets displaced within outer boundary 300. As shown, the outer boundary 300 is fully populated with sub-patterns utilized surrounding target centers 302. Of course, this is a cumulative view and each layer may only include 2 sub-patterns disposed on each layers.

Central pattern recognition enables the most robust image capture and centering by otherwise conventional optical pattern recognition software. Using optical pattern recognition software, one would first center and capture the image of the overlaid target. From that image, one would then determine sub-pattern (cross) centers using conventional threshold or correlation algorithms operating on the images of each sub-pattern. Using the sub-pattern centers, one would then determine, based on the known layout and layer identification (maintained in a database that is accessible at the time of measurement), which sub-patterns define each target pattern on a lithographic field or layer, and then determine the target pattern shape (square or rectangular) centers for each lithographic field or layer. Using the center locations for each target pattern on each field or layer, one would then determine pair-wise differences among centers, i.e., alignment or overlay error between each adjacent field or layer. The center locations of the sub-patterns that define the apices of the target shape also enable determination of the deviation of each shape from its nominal dimensions. This serves as a useful metrology and process diagnostic.

As discussed above, the rectangular nature of the outer boundary may allow for targets to placed in active regions of a wafer (that is, not only in the kerf). Of course, more targets (and thus, more layers) may be accommodated in the kerf if the rectangular outer boundary is used (and the targets disclosed herein) because the length of the outer boundary may be increased without increasing the width. Placing the targets in the active region may, however, create additional constraints.

For example, it may be required that the area within an outer boundary region have similar density requirements to the active regions. To this end, in one embodiment, sub-pattern location to be used in future layer (for example, back end of line layers) may be filled in with photo-resist in front end of the line layers and vice versa.

Figure 6:
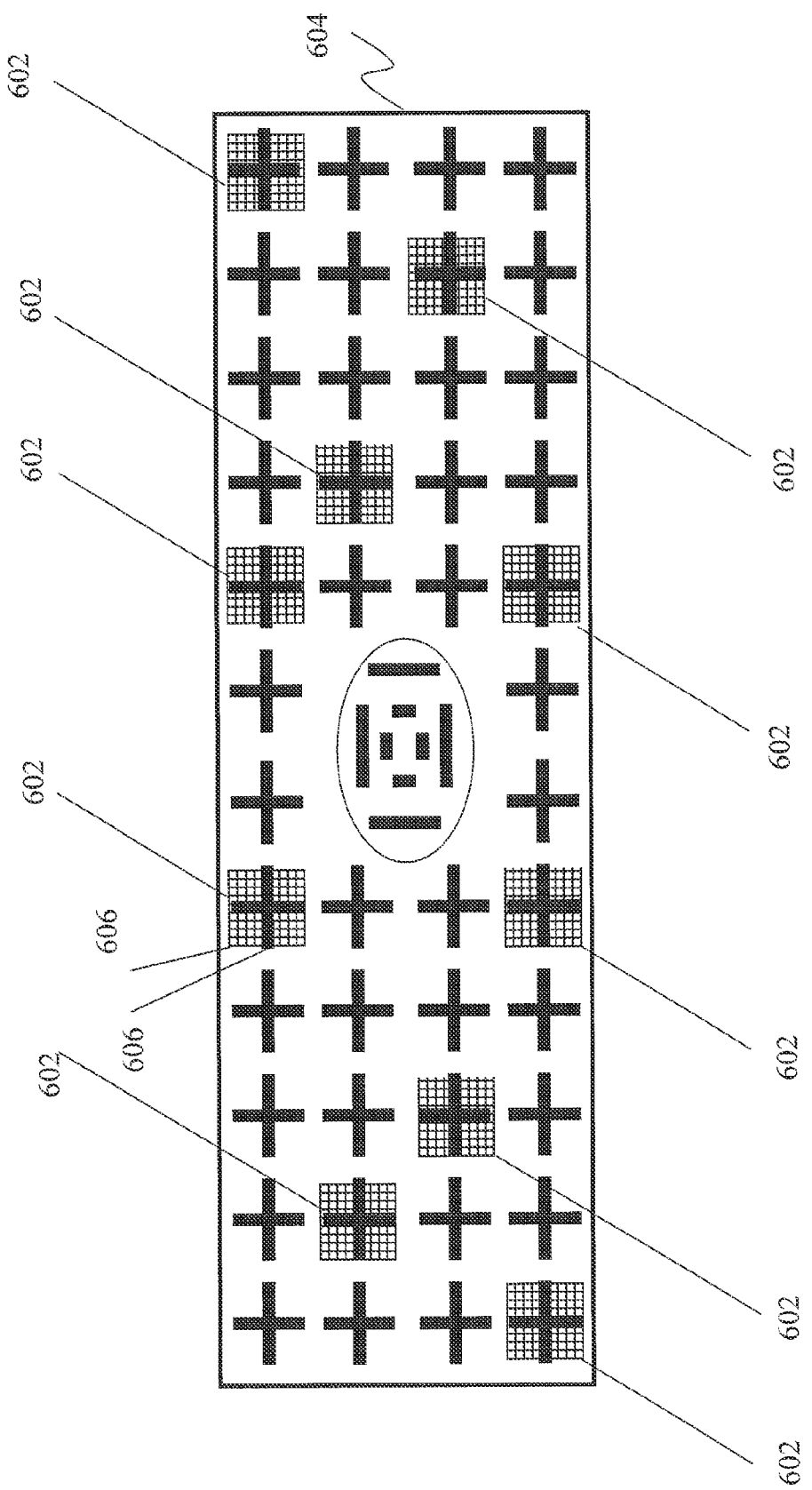
FIG. 6 shows one way in which density considerations may be met in one embodiment.

FIG. 6 shows an example of the a few sub-patterns that have been overlaid with a plurality of fill patterns 602 within an outer boundary 604. In one embodiment, each fill pattern may be segmented (formed of multiple lines 606) at a pitch that is less than a resolution limit of conventional optical pattern recognition software. For example, 15-20 percent of the sub-patterns may be covered to fulfill density requirements.

Figure 7:
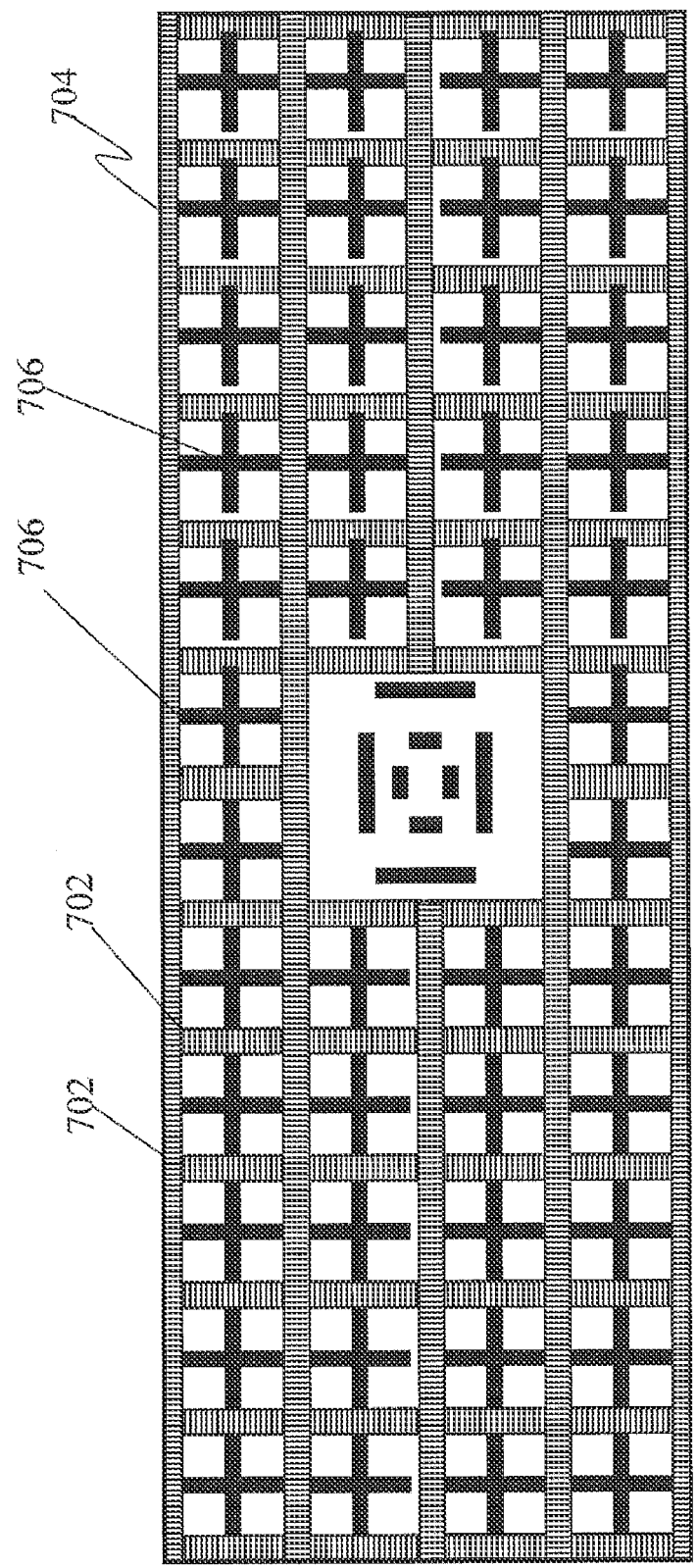
FIG. 7 shows another way in which density considerations may be met in another embodiment.

FIG. 7 shows an alternative fill pattern 702 with an outer boundary 704. The fill pattern 702 in this embodiment may fill interstitial regions between the sub-patterns 706. In one embodiment, the fill pattern 706 may be segmented (formed of multiple lines) at a pitch that is less than a resolution limit of conventional optical overlay metrology tools.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method of determining positioning error between lithographically produced integrated circuit fields on at least one lithographic level comprising:
   creating a first target pattern on a lithographic field containing a first integrated circuit pattern, the first target pattern and the lithographic field being on a lithographic level, the first target pattern comprising two first sub-patterns at first opposing corners of a first rectangle having a first width and a first length, the first length being different than the first width;
   creating a second target pattern on a different lithographic field containing a second integrated circuit pattern, the second target pattern and the different lithographic field being on the a different lithographic level than the first target pattern, the second target pattern comprising two second sub-patterns at second opposing corners of the first rectangle;
   determining the center of the first target pattern and the center of the second target pattern; and
   measuring positioning error between the lithographic fields by comparing locations of the first target pattern center and the second target pattern center.

2. The method of claim 1 further comprising:
   creating a first additional target pattern on a first additional lithographic level, the first additional target pattern comprising a first additional two sub-patterns at first opposing corners of a second rectangle having a second width equal to the first width and a second length, second length being different than the second width and greater than the first length.

3. The method of claim 2, further comprising:
   creating a second additional target pattern on a second additional lithographic level, the second additional target pattern comprising a second additional two sub-patterns at second opposing corners of the second rectangle.

4. The method of claim 1, wherein the sub-patterns have two-fold symmetry about the first target pattern center.

5. The method of claim 1, further comprising:
   creating on the same lithographic level, or on a different lithographic level, a pattern central to a target pattern of the lithographic level, the central pattern being different from the sub-patterns; and
   identifying the central pattern prior to determining the centers of the first and second target patterns.

6. The method of claim 1, wherein the first and second target patterns are disposed within an active region of a wafer.

7. The method of claim 1, wherein the first and second target patterns are not disposed in a kerf region.

8. The method of claim 1, wherein the first and second target patterns are disposed within an outer boundary having a rectangular shape.

9. A method of determining positioning error between lithographically produced integrated circuit fields on at least one lithographic level comprising:
   creating a first target pattern on a lithographic field containing a first integrated circuit pattern, the first target pattern and the lithographic field being on a lithographic level, the first target pattern comprising two first sub-patterns at first opposing corners of a first rectangle having a first width and a first length, the first length being different than the first width;
   creating a second target pattern on a different lithographic field containing a second integrated circuit pattern, the second target pattern and the different lithographic field being on the a different lithographic level than the first target pattern, the second target pattern comprising two second sub-patterns at opposing corners of a second rectangle, the second rectangle being at a right angle to the first rectangle, the second rectangle having a second width and a second length different than the second width;
   determining the center of the first target pattern and the center of the second target pattern; and
   measuring positioning error between the lithographic fields by comparing locations of the first target pattern center and the second target pattern center.

10. The method of claim 9, further comprising:
    creating a first additional target pattern on a first additional lithographic level, the first additional target pattern comprising a first additional two sub-patterns at second opposing corners of the first rectangle.

11. The method of claim 10, wherein the additional lithographic level is different than the first lithographic level.

12. The method of claim 9, wherein the sub-patterns have two-fold symmetry about the first target pattern center.

13. The method of claim 9, further comprising:
    creating on the same lithographic level, or on a different lithographic level, a pattern central to a target pattern of the lithographic level, the central pattern being different from the sub-patterns; and
    identifying the central pattern prior to determining the centers of the first and second target patterns.

14. The method of claim 9, wherein the first and second target patterns are disposed within an active region of a wafer.

15. The method of claim 9, wherein the first and second target patterns are not disposed in a kerf region.

* * * * *